United States Patent [19]

Lackey et al.

[11] 4,282,394
[45] Aug. 4, 1981

[54] UNDERWING REFLECTOR SOLAR ARRAY

[75] Inventors: James A. Lackey, Kent; Harold L. Nordwall, Mercer Island; Charlie B. Whitney, Federal Way, all of Wash.

[73] Assignee: The Boeing Company, Seattle, Wash.

[21] Appl. No.: 88,203

[22] Filed: Oct. 24, 1979

[51] Int. Cl.[3] .............................................. H01L 31/00
[52] U.S. Cl. ................................... 136/245; 136/246; 244/173
[58] Field of Search ..................... 136/89 SA, 89 PC; 244/173

[56] References Cited

U.S. PATENT DOCUMENTS

| 3,477,662 | 11/1969 | Anderson | 244/173 |
|---|---|---|---|
| 3,597,281 | 8/1971 | Webb | 136/89 SA |
| 3,698,958 | 10/1972 | Williamson et al. | 136/89 SA |
| 3,735,942 | 5/1973 | Palz | 244/173 |
| 4,015,653 | 4/1977 | Slysh et al. | 160/213 |

OTHER PUBLICATIONS

"Solar Cell R & D", *Space/Aeronautics*, Apr. 1959, pp. 44-46.
D. D. Abbott, "Lightweight Large Area Solar Arrays", *Proceedings Intersociety Energy Conversion Eng. Conf.*, Wash., D.C., (1969), pp. 772-777.
R. V. Elms, Jr., "Family of Solar Array Design Options", Conf. Record, *13th IEEE Photovoltaic Specialists Conf.*, (1978), pp. 208-214.

Primary Examiner—Aaron Weisstuch
Attorney, Agent, or Firm—Thomas H. Murray

[57] ABSTRACT

A lightweight solar cell array for space vehicles powered by solar electric propulsion. The array incorporates a plurality of hinged solar cell units which can be folded for stowage and thereafter extended into a planar configuration. Light is directed onto the solar cell array by a flexible reflector assembly which is carried below the array. The reflector assembly preferably comprises sheets of flexible material stowed on rolls whereby the sheets can be pulled from the rolls into extended positions. The solar cell array and the reflector are carried between two frames, one of which can be moved away from the other to deploy the array and the reflector assembly.

7 Claims, 5 Drawing Figures

UNDERWING REFLECTOR SOLAR ARRAY

BACKGROUND OF THE INVENTION

While not limited thereto, the present invention is particularly adapted for use with space vehicles, used for various planetary and earth-orbital missions, which are powered by solar electric propulsion (i.e., ion drive). The solar array for such vehicles must be capable of maximum energy conversion efficiency to deliver adequate energy to power the ion thrusters at distances as great as 4.5 AU where the sun's intensity is only 1/20th of that which impinges on the earth. At the same time, a feasible solar array of this type must be lightweight, a realistic target being about 800 kilograms. Adding additional solar cell area to existing arrays is not practical since the weight increase is excessive.

In the past, various arrangements of lightweight plastic film for reflecting concentrators have been tried. These include flat side reflectors, in-panel vee-ridged concentrators, combinations of the above two arrangements, and curved parabolic side concentrators. These systems, however, are unsatisfactory since the weight of the assembly becomes excessive when the geometric concentration ratio is increased to the minimum acceptable value of 4 to 1. Furthermore, in each of the aforementioned prior art arrangements, a reflector-to-sun angle of 30° or less is necessary to reflect sun rays onto the solar cells. As a result, the true reflector width is at least twice the effective width, which is an inefficient use of the reflector weight.

SUMMARY OF THE INVENTION

In accordance with the present invention, a solar array and concentrator assembly is provided for space vehicles powered by solar electric propulsion in which the reflector-to-sun angle is greatly improved over prior art devices and in which the ratio of energy conversion efficiency to weight is maximized.

Specifically, there is provided a solar array comprising a first frame for connection to a support member on a space vehicle or the like, together with a second complementary frame movable away from the first frame. Each of the frames has upper and lower parallel support members with the upper and lower support members lying in common planes. A plurality of flat solar cell devices is hinged together along hinges extending parallel to each other and are adapted, when the second frame moves away from the first, to extend from a folded condition where the solar cell devices are arranged in side-by-side bundled condition to an extended position where all cell devices lie in the same plane. Strips of reflective material are carried on rolls mounted on the lower support member of the first frame, the ends of the strips being connected to the lower support member of the second frame whereby the reflector strips will be unrolled from the rolls as the second frame moves away from the first frame to provide a means for reflecting light onto the solar cells.

In the preferred embodiment of the invention, the first and second frames are each in the form of the letter "X", the upper support member for the solar cells being connected between the ends of the upper legs of the X-shaped configuration and the lower support members for the reflective material extending outwardly from the lower legs of the X-shaped configuration. The second frame is caused to move away from the first so as to extend the solar cell array and the reflector sheets into planar configurations by means of an extensible shaft extending between the centers of the X-shaped frames. In this manner, the tension imparted to the frames when the solar cell assembly is fully deployed will be counterbalanced by the tension imparted to the lower support members by the reflective strips such that no bending moments are transmitted to the extensible shaft. The reflector strips are preferably stored on spring-tension rolls carried on the lower support member of the first frame and are unrolled by virtue of having their ends connected to the lower support member of the second frame which moves away from the first during deployment.

The above and other objects and features of the invention will become apparent from the following detailed description taken in connection with the accompanying drawings which form a part of this specification, and in which.

Figure 1:
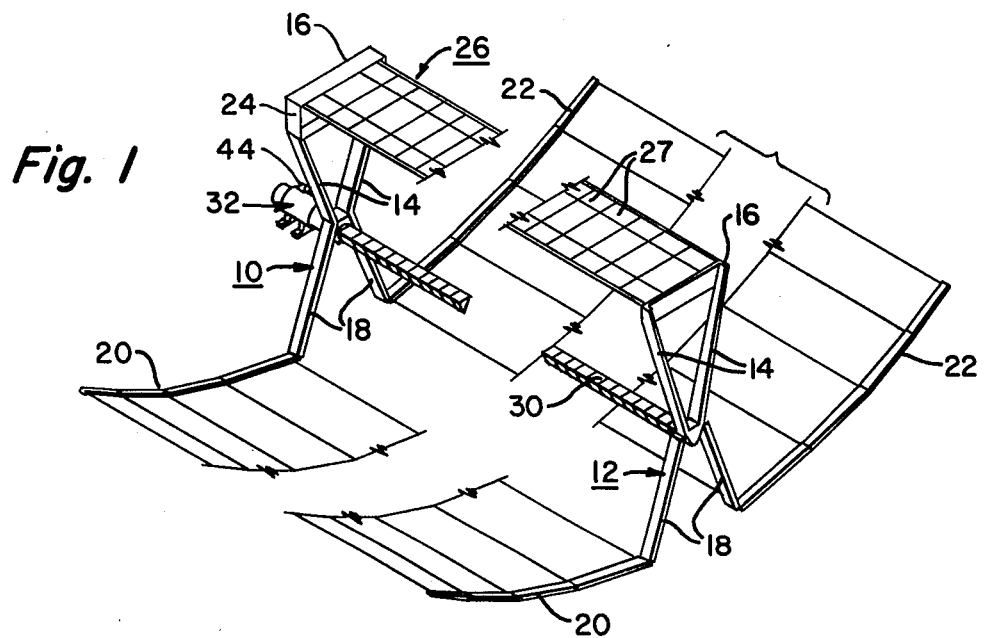
FIG. 1 is a perspective view of the underwing reflector solar array of the invention.

With reference now to the drawings, and particularly to FIG. 1, the array of the invention is shown in its deployed or extended position. It includes a first or inboard frame 10 and outboard frame 12. Both arrays are generally X-shaped in configuration and include a pair of upstanding legs 14 which support an upper transverse support member 16 together with a pair of downwardly-depending legs 18 which support, respectively, foldable reflector arms 20 and 22. The frame 10 and its associated components will be referred to as the "inboard" assembly; whereas the frame 12 and its associated components will be referred to as the "outboard" assembly. The inboard assembly, as will be appreciated, is attached to the skin of a space vehicle, not shown.

Figure 2:
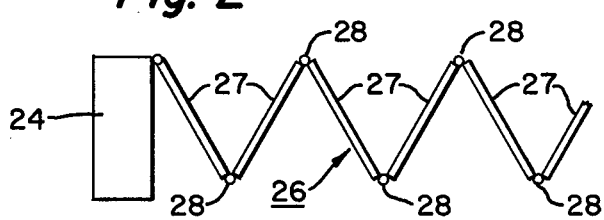
FIG. 2 is a schematic illustration of the manner in which the solar panels utilized in accordance with the invention are folded along hinged edges.

Carried on the legs 14 of the inboard frame 10 is a container 24 for an array blanket, generally indicated by the reference numeral 26 in FIG. 1. The blanket 26 is comprised of a plurality of solar cell panels 27 which, as shown in FIG. 2, are hinged together at points 28 to form an accordian-like structure which can be folded into the array container 24 or extended into the position shown in FIG. 1 where the solar panels face downwardly. In order to move the outboard frame 12 away from the inboard frame 10 and thereby extend the array blanket into a planar configuration, an extensible shaft 30 is connected to the X-shaped frames 10 and 12 at the intersection of their legs 14 and 18. When the outboard frame 12 is retracted toward the inboard frame 10, the extensible shaft 30 is stored within a canister 32.

Figure 3:
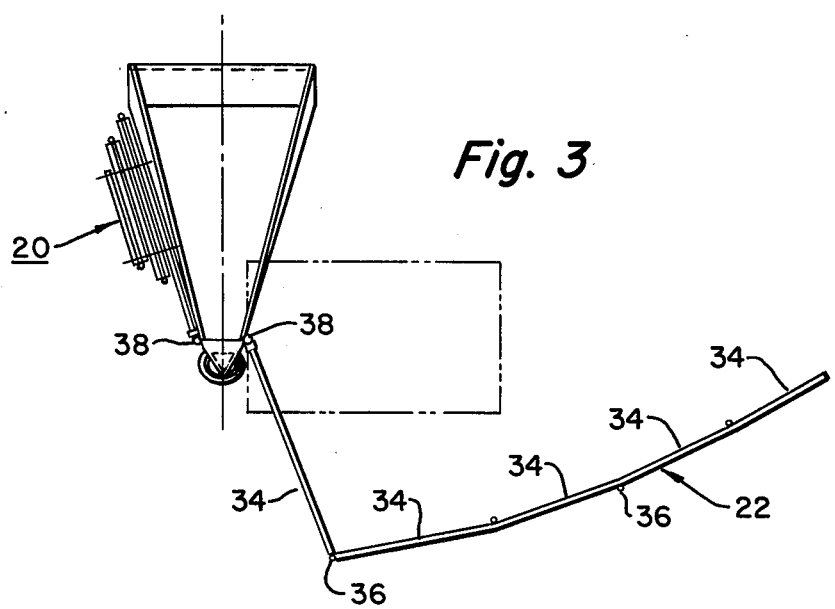
FIG. 3 illustrates the manner in which the lower support members for the reflecting strips can be folded into a compact package for stowage.

As best shown in FIG. 3, the reflector arms 20 and 22 are formed from sections 34 which are hinged together at points 36. The entire arm 20 or 22 is then hinged to a respective X-shaped frame 10 or 12 at points 38. With this arrangement, the entire arm 20, for example, can be folded into the position shown by arm 20 in FIG. 3 or extended into the position illustrated by arm 22 in FIG. 3.

Figure 4:
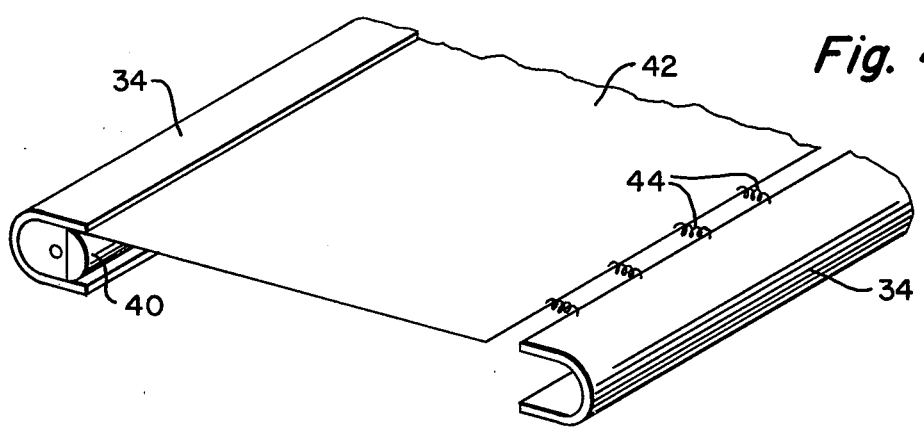
FIG. 4 illustrates the manner in which the reflective strips are carried on one of the two lower support members of the invention.

As shown in FIG. 4, the arm section 34 can be generally U-shaped in configuration. The inboard sections 34 each carry a spring-biased roll 40 having wound thereon a plastic sheet 42 provided on its upper surface with reflective material. The forward end of the sheet 42 is secured to sections 34 on the outboard arm 20 or 22 by means of springs 44. Thus, when the shaft 30 is extended to force the outboard frame 12 away from inboard frame 10, the sheets 42 extending between the respective sections 34 on the inboard and outboard reflector arms 20 and 22 are extended into the essentially planar condition shown in FIG. 1.

Normally, the array blanket 26 is folded and stowed in the array container 24; while the reflector sheets 42 are stowed on the rollers 40 inside each of the inboard arm sections 34. To deploy the array blanket and the reflector, latches, not shown, holding the outboard frame 12 to the space-craft are released. Similarly, stowage straps, not shown, which hold the folded reflector arms 20 and 22 to the legs 14 of frames 10 and 12 are released. The reflector arms then deploy automatically in sequence with each arm section 34 rotating about its hinged connection to the next adjacent section. If desired, the inboard and outboard arms can be linked by a tip tie to synchronize their deployment and compensate for built-in deflection which is used to achieve uniform blanket tension. The reflector arm tip ties and the array container faceplate are released by pyro devices and the extensible shaft 30 is then extended, pulling out the array blanket 26 and the reflector sections 42.

For operation at near-earth solar intensities, the concentration ratio can be reduced by commanding motor drives at the inboard reflector hinge 38 to rotate either both sets of reflectors through angles of up to 12°, thus controlling the amount of sunlight reflected on the solar cells. An articulation drive 44 shown in FIG. 1 can be provided for each array wing for rotation to the desired sun angle. The stowage canister 32 also serves as the articulation shaft.

Figure 5:
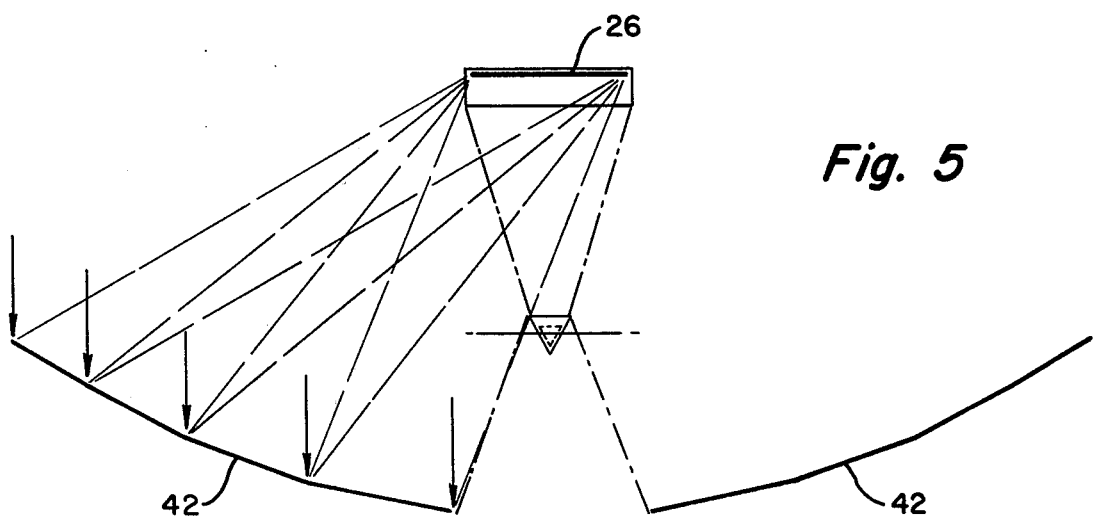
FIG. 5 is a schematic diagram illustrating the array and reflector geometry of the invention.

The array and reflector geometry in their extended positions are shown in FIG. 5. Note that the underside (i.e., the cell side) of the blanket 26 faces away from the sun. The reflector sheets 42 are below the solar cell surface and thus are nearly normal to the sun's rays, thereby reducing reflection losses and sensitivity to misalignments. The reflector width and weight are consequently minimized. This more efficient reflector arrangement results in an achievable geometric concentration ratio of about 5.6 to 1, much higher than that of prior art arrangements.

Since the extensible shaft 30 is centrally located between the array blanket 26 and the reflecting sheets 42, blanket tensions are balanced and no bending moments are transmitted to the shaft 30. This permits the use of a lighter, continuous, longron-type of extensible shaft.

Although the invention has been shown in connection with a certain specific embodiment, it will be readily apparent to those skilled in the art that various changes in form and arrangement of parts may be made to suit requirements without departing from the spirit and scope of the invention.

We claim as our invention:

1. A solar array comprising a first frame for connection to a support member, a second complementary frame movable away from said first frame, each of said frames having upper and lower parallel support members with the upper and lower support members lying in common planes, a plurality of flat solar cell devices hinged together along hinges extending parallel to each other and adapted to extend from a folded condition wherein the solar cell devices are arranged in side-by-side bundled condition to an extended position wherein all cell devices lie in the same plane when said second frame moves away from the first frame, and strips of reflective material carried on the lower support member of said first frame, ends of said strips being connected to the lower support member of said second frame whereby the reflective strips will be extended as said second frame moves away from the first frame to provide a means for reflecting light onto said solar cells.

2. The solar cell array of claim 1 wherein said strips of reflective material are carried on rolls mounted on the lower support member of said first frame, the ends of said strips being connected to the lower support member of said second frame by spring devices.

3. The solar cell array of claim 1 wherein said first and second frames have X-shaped configurations.

4. The solar cell array of claim 3 wherein said parallel support members are carried between the extremities of pairs of legs of said X-shaped configurations.

5. The solar cell array of claim 1 including means for moving said second frame away from said first frame.

6. The solar cell array of claim 5 wherein said means for moving comprises an extensible shaft.

7. The solar cell array of claim 6 wherein said extensible shaft extends between the intersection of upper and lower legs of the X-shaped frames.

* * * * *